United States Patent
Hellberg et al.

(10) Patent No.: US 8,045,939 B2
(45) Date of Patent: Oct. 25, 2011

(54) METHOD FOR CONTROLLING A LINEAR AMPLIFIER AND POWER AMPLIFIER ARRANGEMENT

(75) Inventors: Richard Hellberg, Huddinge (SE); Tony Fondén, Spånga (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 471 days.

(21) Appl. No.: 12/374,898

(22) PCT Filed: Jul. 24, 2006

(86) PCT No.: PCT/SE2006/000907
§ 371 (c)(1),
(2), (4) Date: Jan. 23, 2009

(87) PCT Pub. No.: WO2008/013481
PCT Pub. Date: Jan. 31, 2008

(65) Prior Publication Data
US 2010/0019843 A1    Jan. 28, 2010

(51) Int. Cl.
*H04B 1/04*    (2006.01)
(52) U.S. Cl. ............ 455/127.1; 455/126; 330/127
(58) Field of Classification Search ............ 455/126, 455/127.1, 127.2, 127.3, 561, 562.1; 330/124 R, 330/127, 250
See application file for complete search history.

(56) References Cited

U.S. PATENT DOCUMENTS

| | | | | |
|---|---|---|---|---|
| 5,774,797 A * | 6/1998 | Kawano et al. | ............ | 455/127.2 |
| 5,828,953 A * | 10/1998 | Kawase | ............ | 455/127.2 |
| 7,398,064 B2 * | 7/2008 | Miyatani | ............ | 455/127.1 |
| 7,482,869 B2 * | 1/2009 | Wilson | ............ | 330/127 |
| 7,539,466 B2 * | 5/2009 | Tan et al. | ............ | 455/127.1 |

* cited by examiner

*Primary Examiner* — Quochien B Vuong
(74) *Attorney, Agent, or Firm* — Roger S. Burleigh

(57) ABSTRACT

The present invention relates to a method for controlling an amplifier unit having at least one drive signal input connection 1, at least one power supply voltage input connection 2 and an output connection 4. The amplifier unit comprises at least one amplifier, and the method comprises the steps of: feeding each amplifier by a drive signal from said at least one drive signal input connection 1, and feeding each amplifier by a power supply voltage from said at least one power supply voltage input connection, whereby said amplifier unit has defined output characteristics at the output connection 4 and a predetermined power supply voltage at a maximum RF output power for a RF signal. The method further comprises the steps of: operating at least one amplifier with RF output voltage characteristics to obtain a reduced shunt loss, compared to a reference shunt loss, at the output connection 4. The reference shunt loss is obtained when operating each amplifier as a class B amplifier having the defined output characteristics at the output connection 4 and the predetermined power supply voltage at a maximum RF output power for the RF signal, and modulating the power supply voltage to each amplifier to reduce excessive voltage drop over the amplifier.

24 Claims, 10 Drawing Sheets

METHOD FOR CONTROLLING A LINEAR AMPLIFIER AND POWER AMPLIFIER ARRANGEMENT

TECHNICAL FIELD

The present invention is related to a method for controlling an amplifier unit, especially amplifier units adapted for use in radio communication networks.

BACKGROUND

Description of Related Art

Traditional efficient linear Power Amplifiers (PAs) usually have constant supply voltage and operate in (or near) class B. In class B Operation, i.e. half-wave rectified sine transistor current waveform, the DC (supply) current is proportional to the RF output current (which is the fundamental harmonic component of the half-wave rectified sine). The RF output voltage is also proportional to the RF output current (for the usual linear load resistance). This in turn makes the efficiency proportional to the amplitude of the output signal.

The average efficiency for a class B amplifier, outputting a signal whose average signal level is well below the maximum (peak) level, i.e. that has high peak-to-average ratio, is low compared to the efficiency at maximum output.

In an article with the title, "High-efficiency modulation System," by R. B. Dome, published in Proc. IRE, vol. 26, no. 8, pp. 963-982, August 1938, Load Modulation (LM) PA is disclosed with a variable load which improve upon the basic class B amplifier. A way to achieve a variable load is to have a matching network that can be varied at signal envelope speeds. The average efficiency is increased, if the matching network transforms the load resistance into a high resistance (at the transistor output node) at low output levels and a low resistance (equal to the optimal class B resistance) at high output levels. This decreases the transistor RF output current at all output levels except the maximum, while producing the same RF voltage and current in the load. The RF voltage at the transistor output is at the same time increased. Reduced transistor RF output current is translated into reduced DC current since class B Operation is used.

Examples of PAs having an increased average efficiency are Doherty and Chireix Radio Frequency (RF) PAs. An article with the title "A new high efficiency power amplifier for modulated waves," by W. H. Doherty, published in *Proc. IRE*. vol. 24, no. 9, pp. 1163-1182. September 1936, describe the Doherty RF PA, and an article with the title "High power outphasing modulation," by H. Chireix, published in *Proc. IRE*. vol. 23, no. 11, pp. 1370-1392, November 1935, describes the Chireix RF PA. These PAs are efficient for amplitude-modulated Signals, since they have a lower average sum of RF Output currents from the transistors than a conventional amplifiers output current. This reduced output current is obtained by using two transistors that influence each others output voltages and currents through a reactive output network (that is also coupled to the load). By driving the constituent transistors with the right amplitudes and phases, the sum of RF output currents is reduced at all levels except the maximum. Also for these amplifiers the RF voltage at one or both transistor outputs is increased.

Both LM and Chireix/Doherty amplifiers have constant supply voltage. The amount of output current reduction for these systems is limited by the accompanying RF voltage increase; the RF voltage amplitude cannot generally be larger than the supply voltage other than by a small factor.

Envelope Elimination and Restoration (EER), or Dynamic Drain Biasing (DDB), as described in an article with the title "Single sideband transmission by envelope elimination and restoration", by L R. Kahn, published in Proc. IRE, vol. 40, pp. 803-806. July 1952, uses a supply voltage that varies with the signal envelope. By this, there is no or little excessive voltage drop over the power transistor; all voltage is "used up" by the output RF voltage.

Doherty, Chireix, and LM amplifiers are efficient through reduced average transistor RF output current, which gives a reduced average DC supply current and therefore reduced DC power consumption. Reducing RF current also reduces resistive loss that is effectively in series at the output node. Unfortunately, this effect is accompanied by an increase in at least one of the transistor's RF output voltages, which increases resistive loss that is effectively in shunt (coupled from node to ground) at the transistor output node. Such shunt loss is common in practical RF power transistors, so the theoretical efficiency gains of Doherty, Chireix. and LM amplifiers are often in practice reduced by this type of loss.

EER and DDB amplifiers neither reduce nor increase any of these resistive loss mechanisms, since both RF voltage and RF current at the transistor output node are unaltered from those of the basic amplifier. Although this is better than Doherty, Chireix, and LM amplifiers in case of transistors with large shunt loss, it does nothing to improve the situation.

Until now, the choice has been between using the EER or DDB amplifiers when shunt losses dominates, and Doherty, Chireix, or LM amplifiers when series losses dominate (the success of the method and its implementation in reducing the original "Class B loss" also taken into account).

SUMMARY

An object with the present invention is to provide a power amplifier having an increased efficiency compared to the described prior art power amplifiers.

A solution to the object is provided by combining reverse Doherty, Chireix, or LM techniques with EER or DDB amplifiers. Operating Doherty, Chireix, or LM amplifiers in reverse, i.e. increasing RF current and decreasing RF voltage, decreases the efficiency instead of increasing it. This idea on its own thus produces super-inefficient amplifiers. It does however reduce one loss mechanism, the shunt loss, by reducing the RF voltage at an output node. By then applying EER or DDB, the loss due to excessive voltage drop can still be minimized, provided a dynamic supply voltage is used that varies as a new function of the signal envelope.

An advantage with the present invention is that by addition of EER/DDB, reverse Doherty, reverse Chireix, or reverse Load Modulation can be used to increase efficiency even in situations where transistor shunt losses would render the regular Doherty, Chireix, or Load Modulation methods more or less useless.

DETAILED DESCRIPTION

Introducing Doherty, Chireix, or LM techniques to EER or DDB amplifiers has so far been considered ineffective, since when EER or DDB performs well on its own, and Doherty, Chireix, or LM techniques do not significantly contribute to the efficiency.

In essence, two methods that solve the same problem in different ways are turned into a combination that solves two different problems, by using one of the methods in reverse.

The invention combines reverse Doherty, Chireix, or LM techniques with EER or DDB amplifiers. Operating Doherty, Chireix, or LM amplifiers in reverse, i.e. increasing RF current and decreasing RF voltage, decreases the efficiency instead of increasing it. This idea on its own thus produces super-inefficient amplifiers, and thus has never been considered for implementation. It does however reduce one loss mechanism, the shunt loss, by reducing the RF voltage at the output node(s), compared to a reference shunt loss, such as the shunt loss obtained when operating the amplifier as a class B amplifier having the same output characteristics at the output node(s) and the same power supply voltage at a maximum RF output power for the RF signal. By then applying EER or DDB, the loss due to excessive voltage drop can still be minimized, provided a dynamic supply voltage is used that varies as a new function of the signal envelope.

Figure 1:
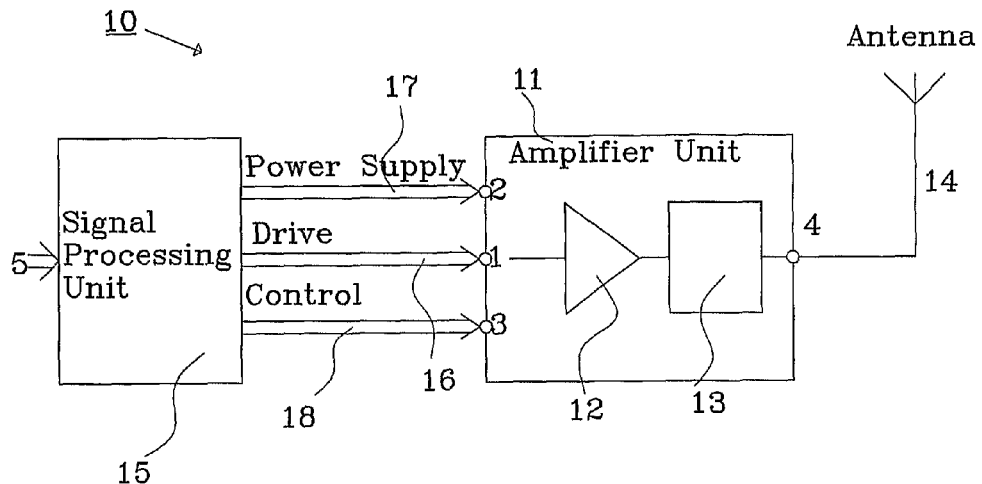
FIG. 1 shows a block diagram illustrating the general concept of the present invention.

FIG. 1 shows a block diagram illustrating the general concept of the invention. A signal amplifying system 10 comprises an amplifier unit 11 and a signal processing unit 15 being supplied with an input information signal 5. An output connection 4 of the amplifier unit 11 is connected to an antenna 14, and signals 16, 17 and 18 are fed from the signal processing unit 15 to respective input connections 1, 2 and 3 of the amplifier unit 11. The amplifier unit 11 further comprises at least one amplifier 12 and a matching network 13.

At least one drive signal 16, which contains the signal information to be amplified and transmitted from the antenna 14, is fed to drive signal input connection 1 of the amplifier unit 11. Each drive signal is connected to an amplifier 12 as described below. At least one power supply voltage 17 is provided to the amplifier unit 11 and is fed to respective amplifier 12 and at least one control signal 18 is provided to a control signal input connection 3. In some of the preferred embodiments described below, the control signal 18 is combined with the drive signals 16, whereby a separate control signal input connection 3 may be omitted.

The purpose of the matching network 13 is to reduce a load impedance seen from each amplifier output to be below an optimal load impedance at maximum output power from each amplifier 12, at least in a part of an output power amplitude range. This is illustrated in described preferred embodiments below.

Preferred Embodiments

1) Reverse Load Modulation System Combined with EER/DDB

Figure 2:
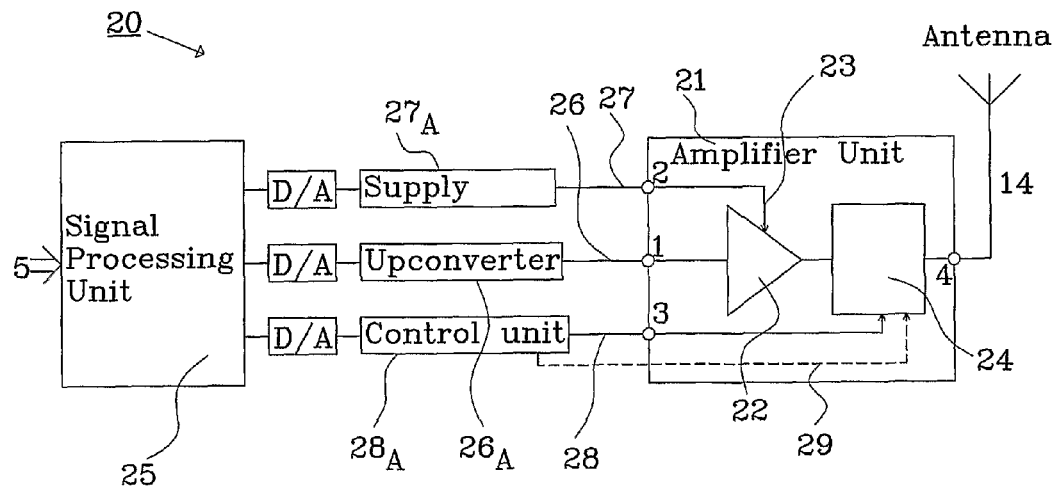
FIG. 2 shows a first embodiment of an amplifier according to the invention.

FIG. 2 shows a first embodiment of a signal amplifying system 20 comprising a reverse Load Modulation system combined with EER/DDB. An amplifier unit 21 comprises a power amplifier (PA) 22 fed by a controlled power supply voltage through line 23, and connected via a controlled matching network 24 to a load, such as an antenna 14. An input of the PA 22 is connected to a drive signal input connection 1 of the amplifier unit, and an output of the PA 22 is connected to the matching network 24. The line 23 for feeding the power supply voltage to the PA 22 is connected to a power supply input connection 2 and the matching network is connected to a control signal input connection 3.

The creation of all control and drive (RF) signals is in this embodiment implemented in one signal processing unit 25. This is convenient also in practice, since all signals originate from the same input information signal 5. Knowledge and subsequent correction of the behavior of one component affect the control and drive signals to the others.

The signal processing unit 25 is provided with means to form the necessary control and drive signals to be supplied to the amplifier unit 21 from the input information signal 5. In this embodiment a drive signal 26, a control signal 28 and a controlled power supply voltage 27 needs to be provided to the amplifier unit 21. All signals are created digitally in the signal processing unit 25 and are converted to analog signals using separate Digital-to-Analog converters (D/A). The drive signal 26 is processed in an upconverter $26_A$ before the drive signal is fed to the drive signal input connection 1 of the amplifier unit 21. The power supply voltage is processed in a power supply unit $27_A$ before the power supply voltage is applied to the power supply input connection 2, and the control signal 28 is processed in a control unit $28_A$ before the control signal is fed to the control signal input connection 3. Optional control signals may be fed to the matching network from the control unit $28_A$ as indicated by the dashed line 29.

Reactances in the matching network are controlled (at envelope speeds) so that the network dynamically transforms the load impedance at the output connection 4 into another impedance at the PA transistor's output. Typically, the controlled reactances are voltage-controlled capacitors. Reverse LM means that this impedance is lower than the optimal "class B" load for a wide range of output levels.

To get the right output amplitude at the load (usually an antenna) the drive signal to the PA must have higher amplitude than the usual class B amplitude at these output levels. This produces the greater RF output current needed.

The supply voltage is controlled in the same manner as in an ordinary EER application, but with even lower supply voltage for a wide range of output levels to accommodate the lower RF voltage swings due to the reverse dynamic load matching.

An exemplary reverse Load Modulation system combined with EER/DDB is built with a transistor that has an optimal load resistance $R_{opt}$ (i.e. that gives maximum Output in class B Operation) of 1, a shunt loss resistance $R_{loss}$ of 2, a maximum RF voltage at the transistor Output of 1, no "knee" voltage $V_{knee}=0$ (maximum transistor RF output voltage amplitude assumed to be supply voltage minus knee voltage), and a maximal RF output current of 1.5. Pertinent currents, voltages, powers and efficiencies are shown versus the PA's normalized Output Signal amplitude, in FIGS. 3a-3c and 4.

Figure 3A:
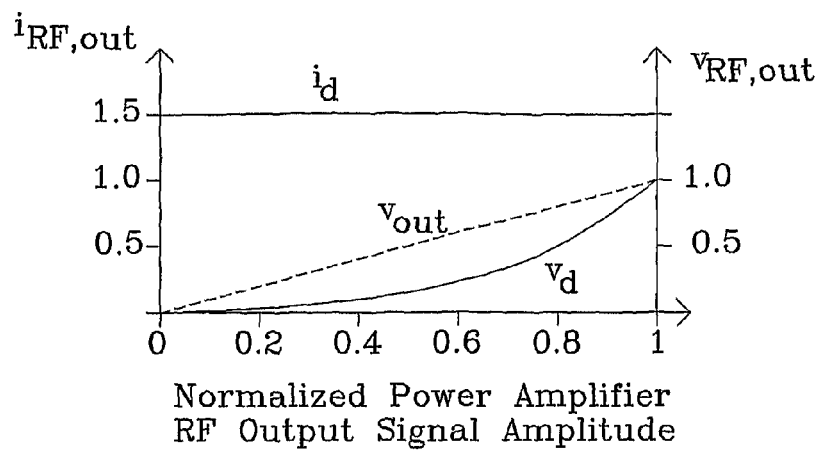
FIGS. 3a-3c show the RF characteristics of the embodiment in FIG. 2.

FIG. 3a shows a output RF voltage $v_d$ of the transistor (lowest trace) and the RF output current $i_d$ (constant at 1.5). The PA's output signal voltage $v_{out}$ (linear, middle dashed trace) is included as a reference.

Figure 3B:
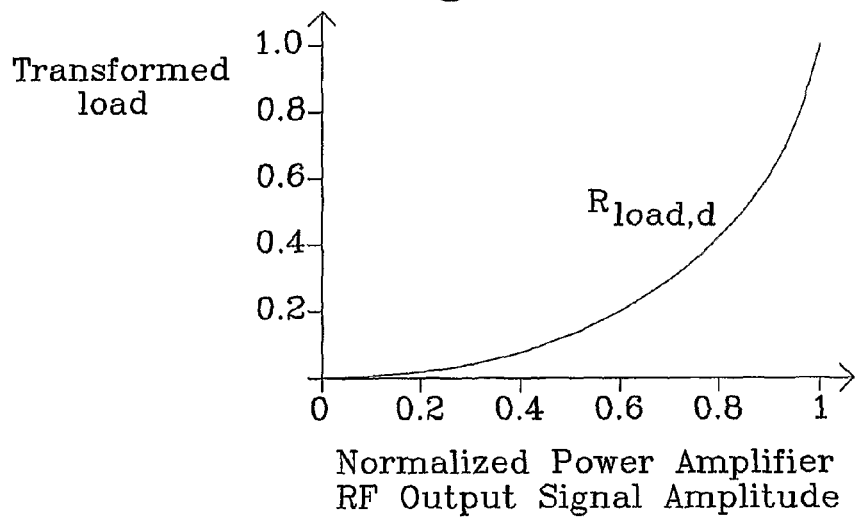

FIG. 3b shows the transformed load $R_{load,d}$ as seen at the transistor output. Due to the absence of a knee voltage ($V_{knee}=0$), the transformed load can at all levels be as low as possible so that it gets as much of the RF current as possible. The only limiting factor is the maximum current the transistor can deliver. (In practice there can also be a limit to the ratio of lowest to highest transformation. The transformed load can then be kept constant at its lowest below a certain output level, and the RF output current should consequently be a linearly increasing function in this range.)

Figure 3C:
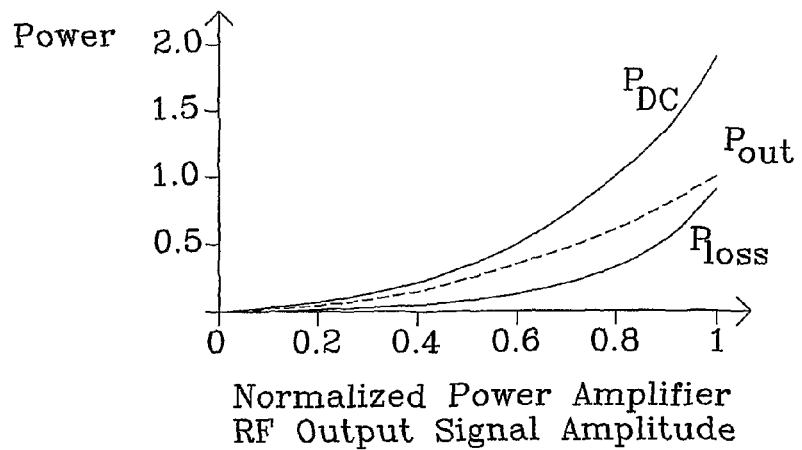

FIG. 3c shows the DC supply power $P_{DC}$ (top trace), the output power $P_{out}$ (middle dashed trace) and the loss power $P_{loss}$ (bottom trace).

Figure 4:
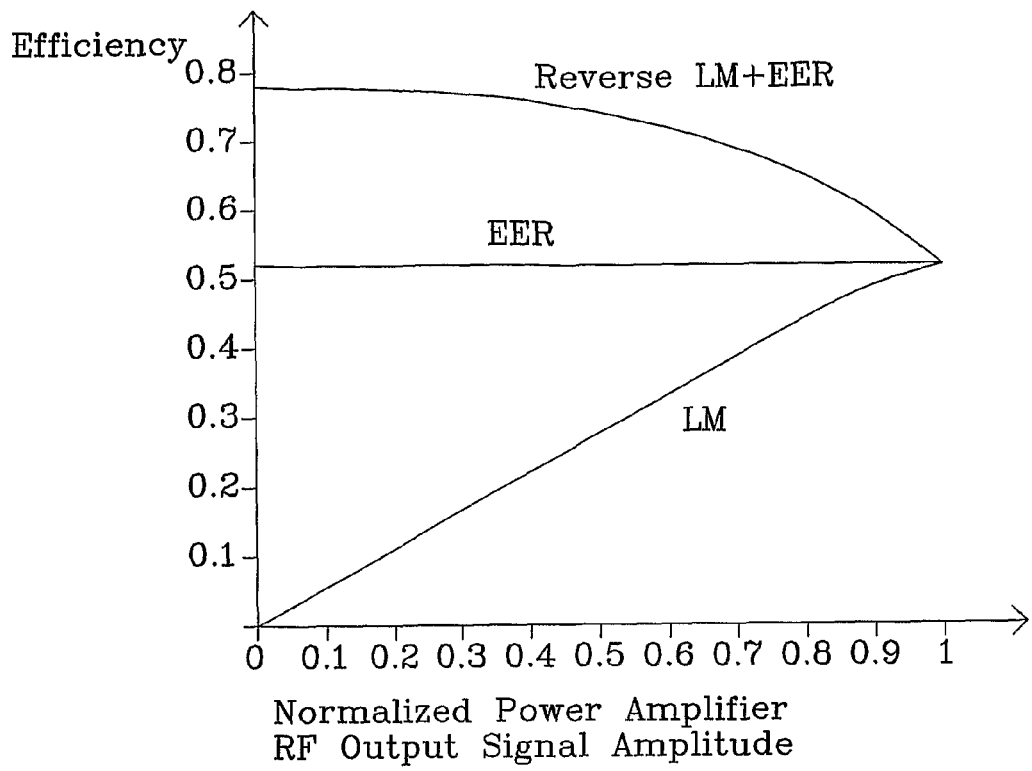
FIG. 4 shows a graph with the efficiency of the embodiment in FIG. 2 in comparison with LM and EER power amplifier efficiency.

FIG. 4 shows the efficiency curve of the PA (top trace). The efficiency at the lowest output level is the ideal class B efficiency 78.5%. At maximum output, the efficiency is ⅔ of the class B efficiency, which indicates that ⅔ of the transistor output power goes to the load (transformed to 1 at this level) and ⅓ feeds the shunt loss resistance.

FIG. 4 also shows, for the transistor described in connection with FIGS. 3a-3c, the efficiency of a regular LM system (bottom trace), and EER system (middle trace). The absence of a knee voltage gives the EER system a constant efficiency. The Load Modulation system suffers heavily from the low shunt loss resistance and is only marginally better than a plain class B stage. The EER system is seen to benefit greatly from the addition of reverse Load Modulation, the combination being 50% more efficient than EER alone at low output levels.

Figure 5A:
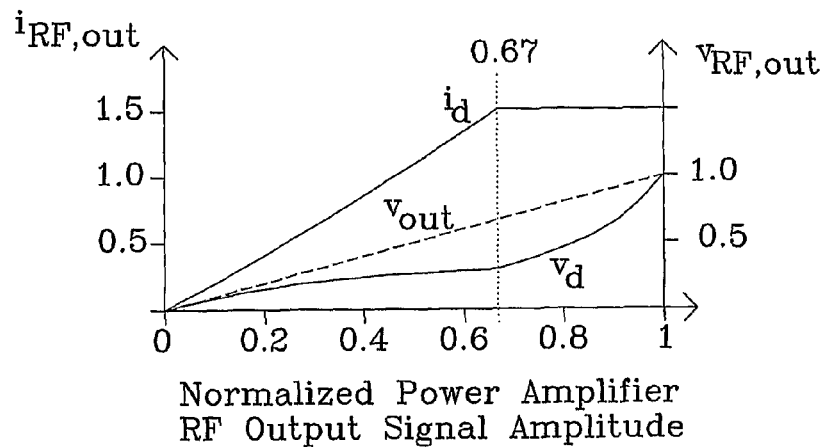
FIGS. 5a-5c show the RF characteristics of the embodiment in FIG. 2 with a knee voltage.
Figure 5B:
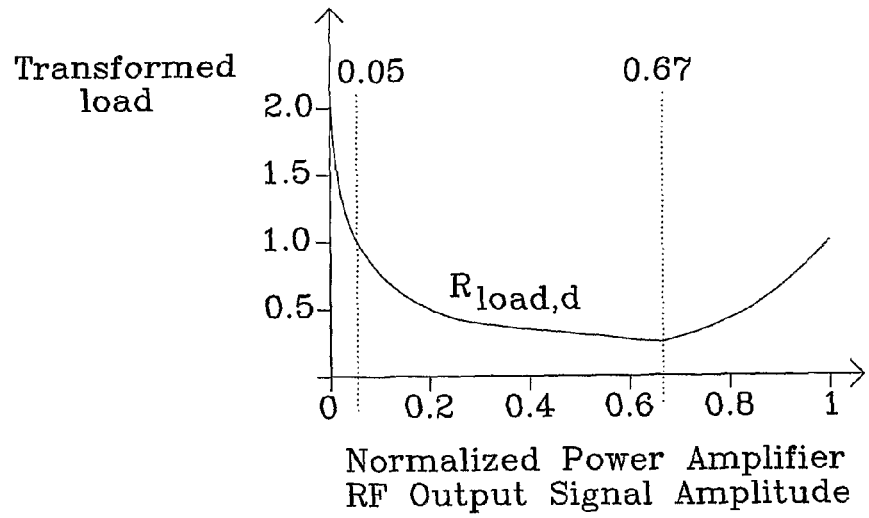
Figure 5C:
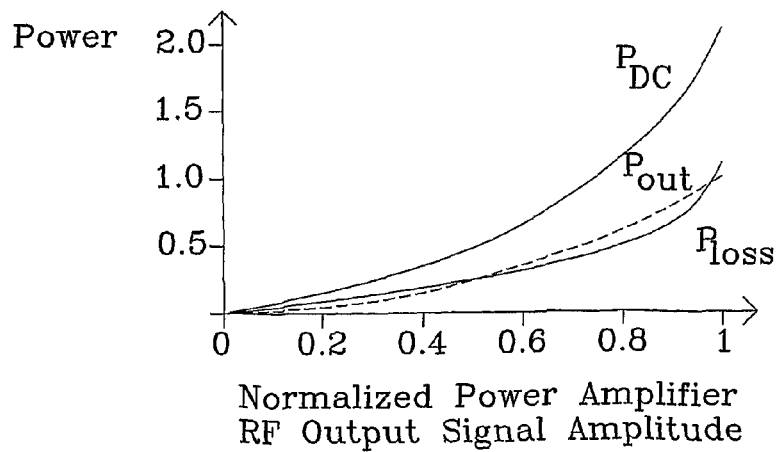

The next example is identical to the previous one except for the addition of a constant "knee" voltage, here modeled as an addition of 10% of the maximum DC supply voltage to the supply voltage at all levels. This gives an extra DC power loss proportional to the DC current (and hence RF) which must be considered for optimal Operation. FIGS. 5a-5c show the transistor's RF output voltage and current, the dynamically transformed load impedance, and the supply voltage, versus the normalized power amplifier output signal amplitude.

FIG. 5a shows the transistor's output RF voltage $v_d$ (lowest trace) and the RF output current $i_d$ (top trace). The PA's output signal voltage $v_{out}$ (linear, dashed trace) is included as a reference. The current $i_d$ is seen to increase much more slowly at low levels (up to the point of being the maximal possible) than in the previous example, in order not to feed the knee voltage loss via the proportional DC current.

FIG. 5b shows the transformed load $R_{load,d}$ as seen at the transistor output. At the lowest (5%) output levels, the LM System operates regularly, i.e. increasing the transformed load. This region is insignificant to the efficiency, so the transformed load can in practice be kept below the optimal (here normalized to 1) in this region too, to keep the ratio of lowest to highest transformation as low as possible. In the upper 95% output levels, reverse load modulation is optimal. From 5% to 67% of the maximum output level, the reverse load modulation is determined by a balance between shunt loss (that is low for a low transformed load) and knee voltage loss (that is low for a high transformed load). Above 67%, the RF current is the limiting factor, so the transformed load must increase to provide increasing RF output signal amplitude.

FIG. 5c shows the DC supply power $P_{DC}$ (continuous top trace), the output power $P_{out}$ (dashed trace) and the loss power $P_{loss}$ (continuous bottom trace).

Figure 6:
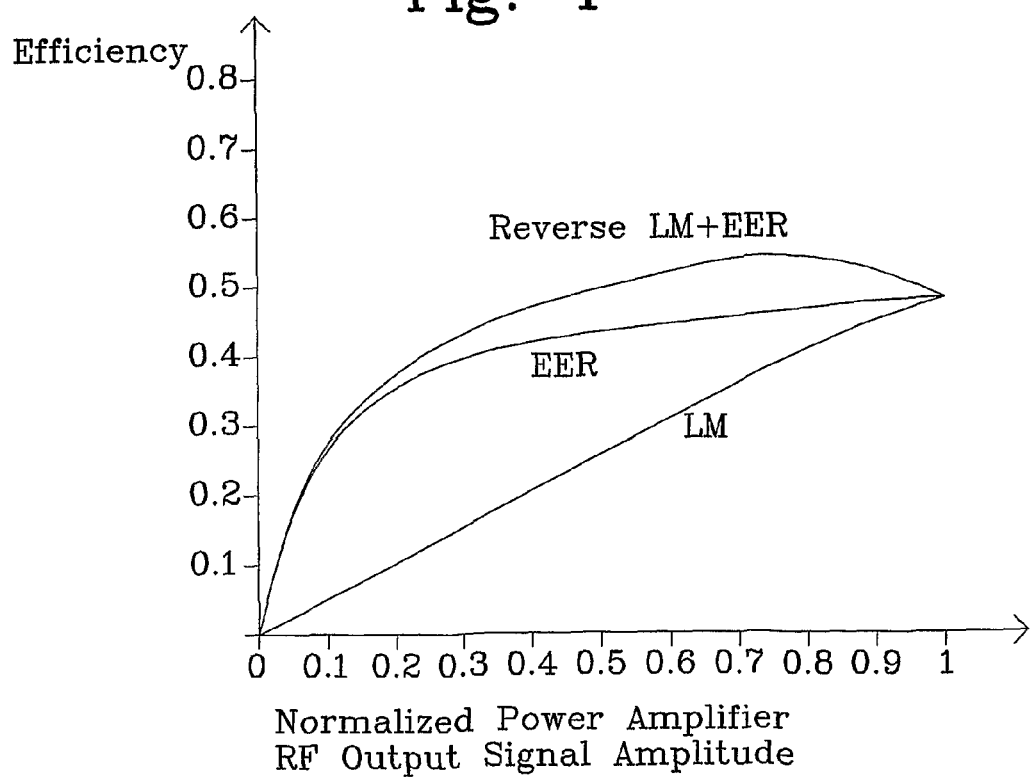
FIG. 6 shows a graph with the efficiency of the embodiment in FIG. 2 with a knee voltage in comparison with LM and EER power amplifier efficiency.

FIG. 6 shows, for the transistor with knee voltage, the efficiency of a regular Load Modulation System (bottom trace), EER system (middle trace) and reverse Load Modulation System combined with EER (top trace). The knee voltage lowers the efficiency of the EER System more at low levels than at high levels. The EER system is here seen to benefit most from the addition of reverse Load Modulation at medium to high output levels.

Figure 7:
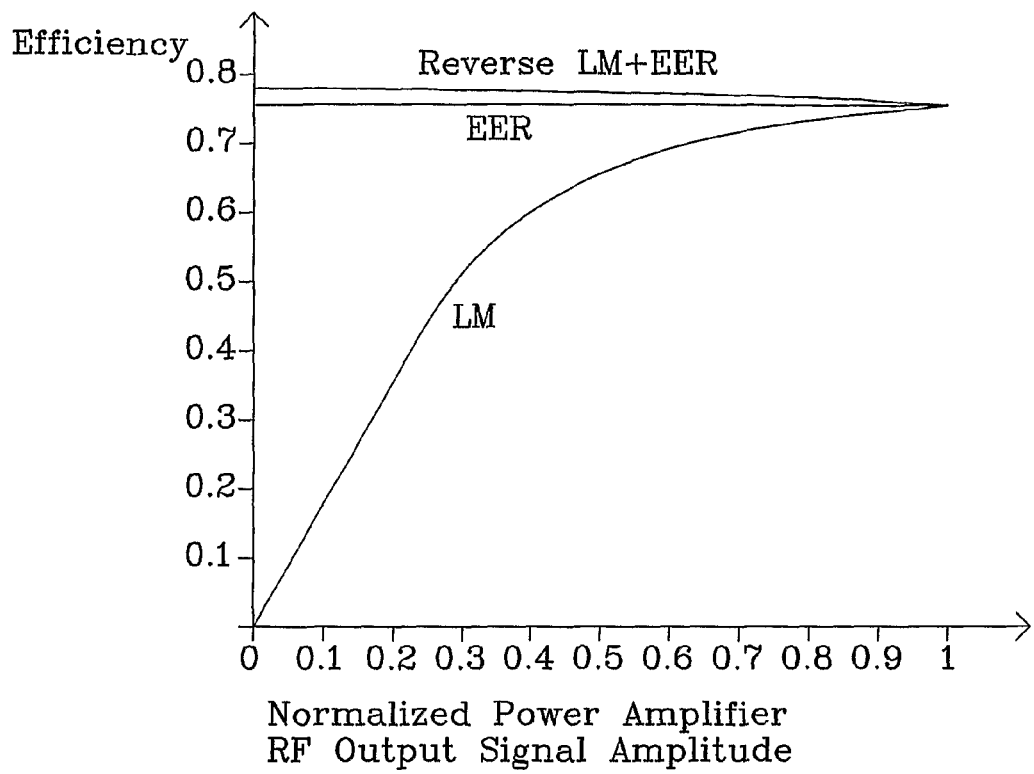
FIG. 7 shows a graph with the efficiency of the embodiment in FIG. 2 in comparison with LM and EER power amplifier efficiency when the shunt resistance is 20 times the optimal load.
Figure 8:
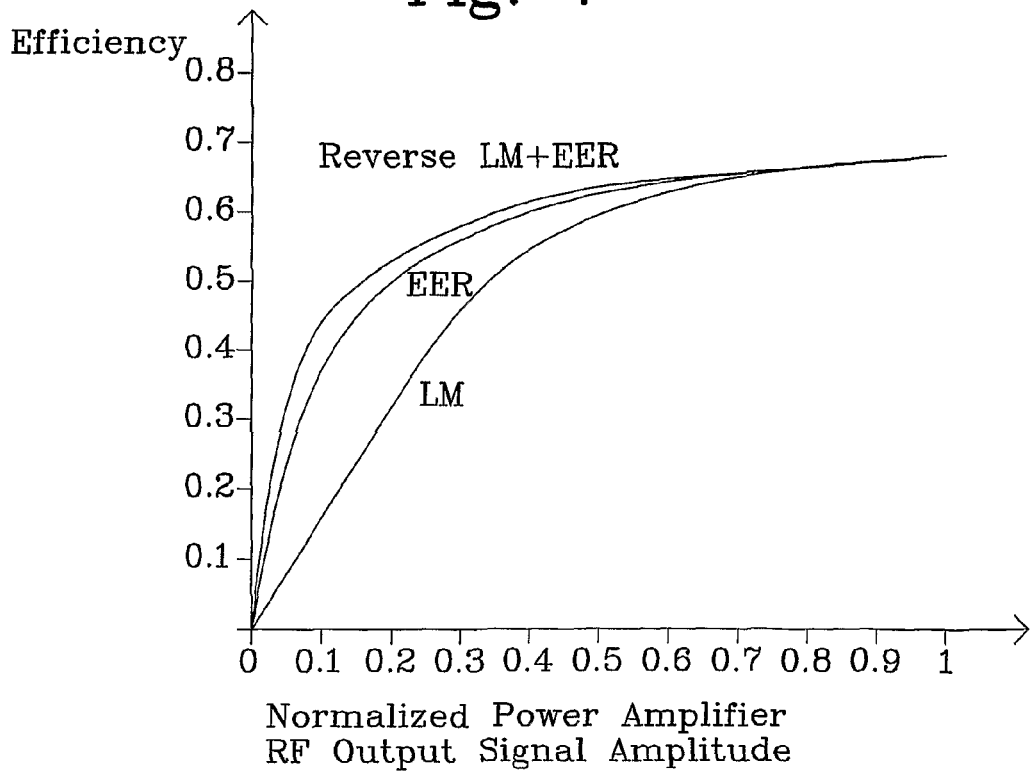
FIG. 8 shows a graph with the efficiency of the embodiment in FIG. 2 in comparison with LM and EER power amplifier efficiency with a knee voltage when the shunt resistance is 20 times the optimal load.

A higher shunt resistance gives lower shunt loss, which decreases the benefit of adding reverse Load Modulation to the EER system. This is shown in FIG. 7, for systems built with a transistor with a shunt resistance 20 times the optimal load, but with no knee voltage. (The order of the traces the same as in FIG. 4.) FIG. 8 shows the same, but with an added knee voltage of 10%. (Same order of the traces.)

2) Reverse Chireix System Combined with EER/DDB

Figure 9:
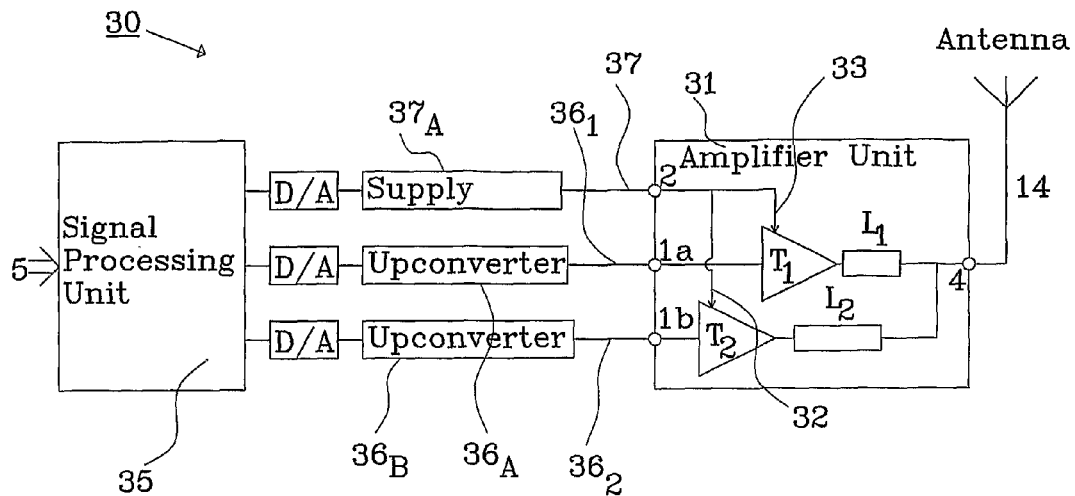
FIG. 9 shows a second embodiment of an amplifier according to the invention.

A reverse Chireix system combined with EER/DDB consists of a Chireix PA fed by a controlled voltage supply. Since the RF voltages on the outputs of the constituent transistors in the reverse Chireix amplifier have equal amplitudes, only one controlled supply voltage is needed (as opposed to the reverse Doherty/EER amplifier discussed in a later section). FIG. 9 shows a second embodiment of a signal amplifying system 30 comprising a reverse Chireix system combined with EER/DDB. An amplifier unit 31 comprises a first power amplifier $T_1$ and a second power amplifier $T_2$. Both $T_1$ and $T_2$ are fed by a controlled common power supply voltage through lines 32 and 33, respectively. An output of the first power amplifier $T_1$ is connected to an output connection 4 of the amplifier unit 31 via a first transmission line $L_1$, and an output of the second power amplifier $T_2$ is connected to the output connection 4 of the amplifier unit 31 via a second transmission line $L_2$. The output connection 4 is connected to a load, such as an antenna 14. An input of the first power amplifier $T_1$ is connected to a first drive signal input connection 1a of the amplifier unit 31, and an input of the second power amplifier $T_2$ is connected to a second drive signal input connection 1b of the amplifier unit 31. The lines 32 and 33 for feeding the power supply voltage to $T_1$ and $T_2$ are connected to a power supply input connection 2. In contrast to the first described embodiment, there is no need for a separate control signal in this embodiment, since the drive signals fed to the power amplifiers $T_1$ and $T_2$ are used for this purpose.

The signals are also here regarded as coming from a combined "Signal Processing" block 35. The signal processing unit 35 is provided with means to form the necessary control and drive signals to be supplied to the amplifier unit 31 from the input information signal 5. In this embodiment a first drive signal $36_1$, a second drive signal $36_2$ and a controlled power supply voltage 37 needs to be provided to the amplifier unit 31. The drive signals to each amplifier may be modified in both phase and amplitude in such a way that the phase and amplitude is altered relative to the phase and amplitude desired at the output connection. All signals are created digitally in the signal processing unit 35 and are converted to analog signals using separate Digital-to-Analog converters (D/A). The drive signals $36_1$ and $36_2$ are processed in two separate upconverters $36_A$ and $36_B$ before the drive signals are fed to the first and second drive signal input connection 1a and 1b, respectively, of the amplifier unit 31. The power supply voltage is processed in a power supply unit $37_A$ before the power supply voltage is applied to the power supply input connection 2.

The reverse Chireix system can be built with the same components as the regular Chireix system. It is however generally not dimensioned equally. The Chireix can be defined by two transmission lines from the transistors outputs to the common load, the sum of electrical lengths being a half wavelength, i.e. $L_1+L_2=\lambda/2$. The examples give the lengths for these prototypical transmission lines.

Reverse Chireix action causes the transistors' RF currents to be higher than conventional class B currents in a wide range of output levels. The RF voltages are consequently lowered. The effect is the same as in the previously discussed reverse Load Modulation system. In the Chireix amplifier, varying the relative phases of the transistors' output currents and voltages causes this effect. The supply voltage must follow the lowered voltage amplitudes for the system to be efficient.

An exemplary reverse Chireix system combined with EER/DDB is built with two power amplifiers that each have an optimal load resistance of 2, a shunt loss resistance of 4 (the same relation to the optimal load as in the first LM/EER example), a maximum RF voltage at the transistor output of 1, no "knee" voltage, and a maximal RF output current of 0.75. Transmission lines having characteristic impedance equal to the optimum load for each transistor connect the transistors to a common load equal to the parallel connection of these two optimal loads. The electrical lengths of these transmission lines are $0.07\lambda$ from power amplifier $T_1$ and $0.43\lambda$ from power amplifier $T_2$. The behaviour of the amplifier unit is shown in FIGS. 10a-10c.

Figure 10A:
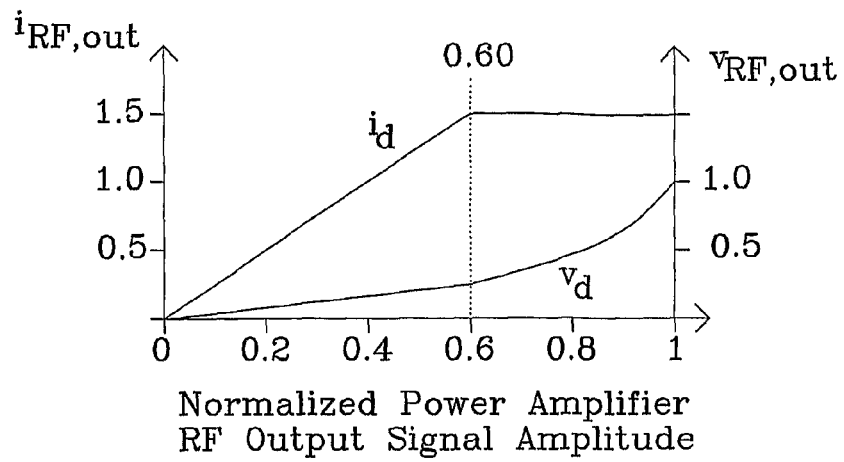
FIGS. 10a-10c show the RF characteristics of the embodiment in FIG. 9.
Figure 10B:
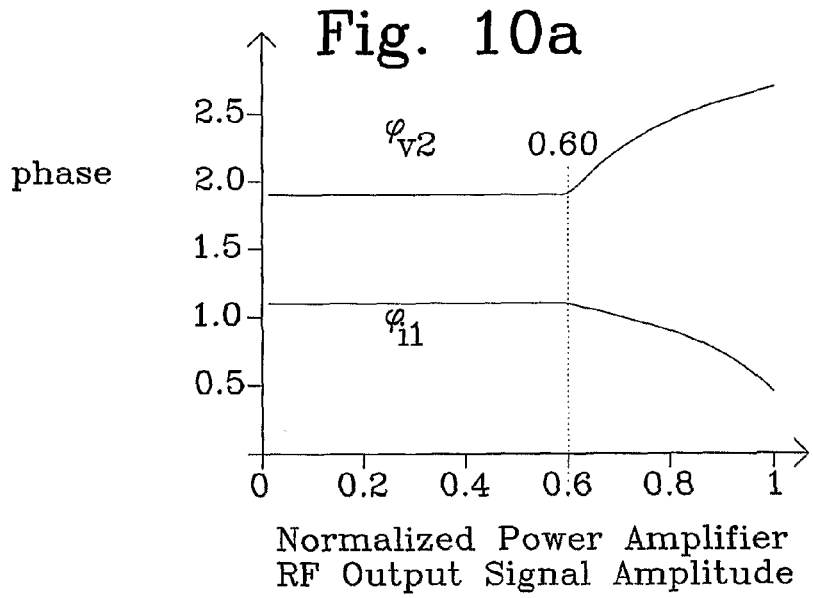

FIG. 10a shows the power amplifiers output RF voltage amplitudes $v_d$ (lowest trace), which is equal for the power amplifiers, and summed RF output current amplitude $i_d$. FIG. 10b shows the phase of the voltage $\phi_{v2}$ at the second amplifier output relative to the voltage phase at the common output 4, and the phase of the current $\phi_{i1}$ of first amplifier output relative to the current phase at the common output 4. The non-plotted phases are symmetrical to the plotted ones about $\pi/2$. We see that the Operation mode is the same in the lower 60% of the output range, above which the system gradually changes phases of the currents and voltages to cope with the output current limitations at 0.75.

Figure 10C:
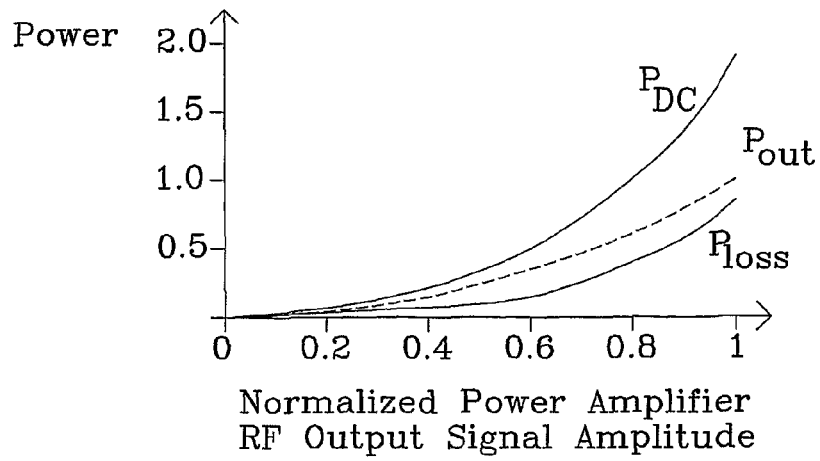

FIG. 10c shows the DC supply power (continuous top trace), the output power (dashed middle trace) and the loss power (continuous bottom trace).

Figure 11:
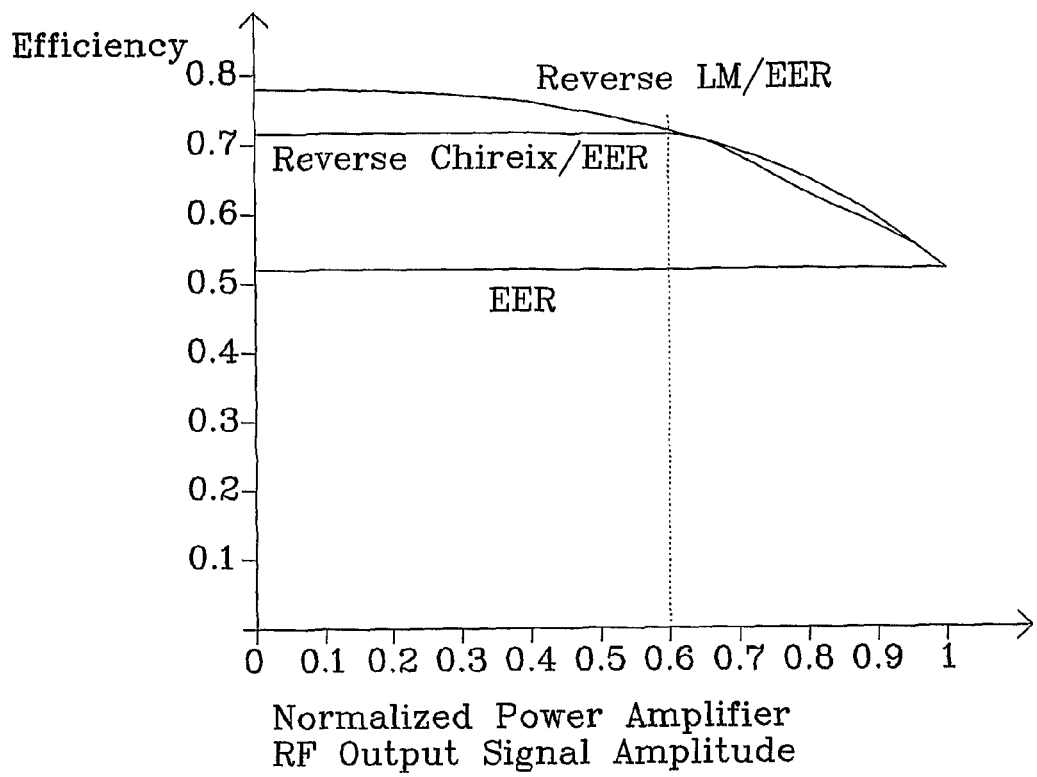
FIG. 11 shows a graph with the efficiency of the embodiment in FIG. 9 in comparison with reverse LM/EER and EER power amplifier efficiency.

FIG. 11 shows the efficiency curve of the reverse Chireix/EER PA. The efficiency in the lower 60% output region is constant after which it starts to fall off towards ⅔ of class B efficiency. FIG. 11 also includes the efficiency curve of reverse Load Modulation/EER and ordinary EER from FIG. 4. The reverse Load Modulation system is more efficient at all levels, and the reverse Chireix variant reaches that efficiency at two points in the output range (of which one is always at the topmost level) when only two amplifiers are used.

The next example is identical to the previous one except for the addition of a constant, additional 10% "knee" voltage. The electrical lengths of the transmission lines have been changed and are here $0.085\lambda$ from the first amplifier and $0.415\lambda$ from the second amplifier. The behaviour of the amplifier unit is shown in FIGS. 12a-12c.

Figure 12A:
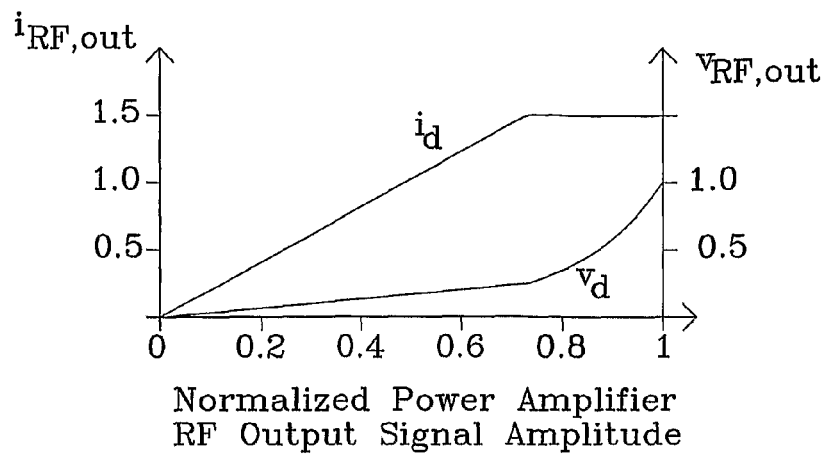
FIGS. 12a-12c show the RF characteristics of the embodiment in FIG. 9 with a knee voltage.
Figure 12B:
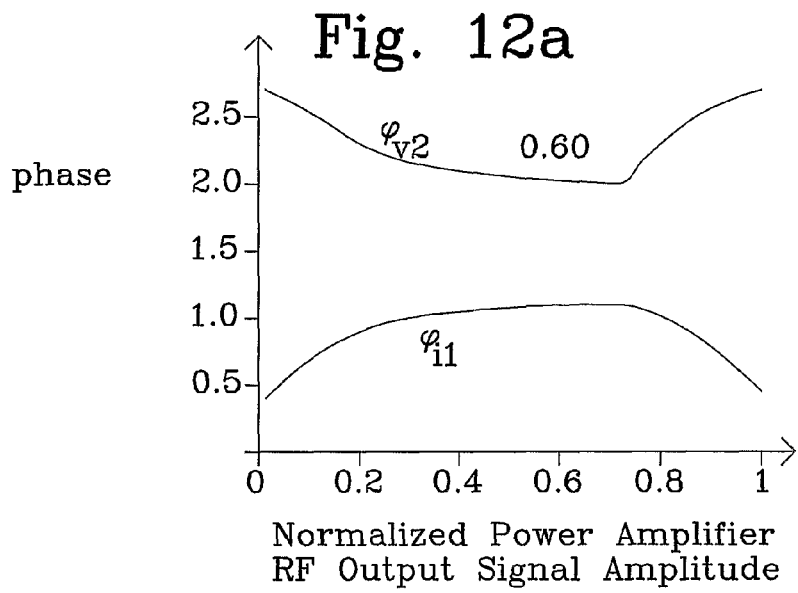

FIG. 12a shows the power amplifiers output RF voltage amplitudes $v_d$ (lowest trace), which is equal for the power amplifiers, and summed RF output current amplitude $i_d$. FIG. 12b shows the phase of the voltage $\phi_{v2}$ at the second amplifier output relative to the voltage phase at the common output 4, and the phase of the current $\phi_{i1}$ of first amplifier output relative to the current phase at the common output 4. The non-plotted phases are symmetrical to the plotted ones about $\pi/2$. The operation is different compared to the previous example in the lowest range. The voltage is increasing faster due to the phases being closer to those of class B operation to overcome the knee voltage loss.

Figure 12C:
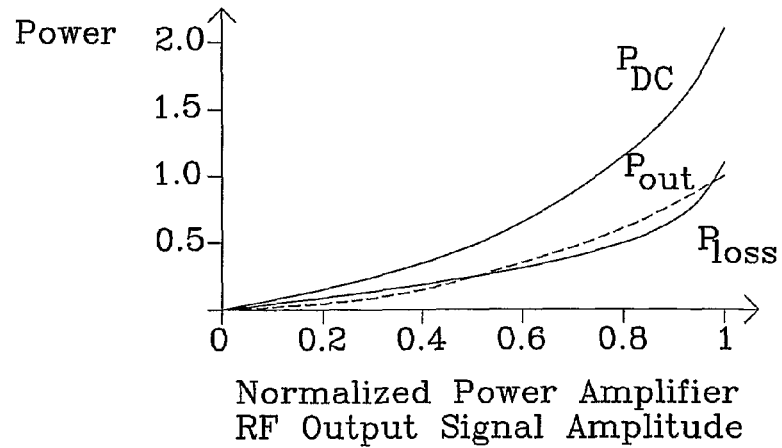

FIG. 12c shows the DC supply power (continuous top trace), the output power (dashed trace) and the loss power (continuous bottom trace).

The efficiency curve of the reverse Chireix/EER PA according to the example is almost identical to the efficiency curve for the reverse LM/EER PA shown in connection with FIG. 6.

3) Reverse Doherty System Combined with EER/DDB

Figure 13:
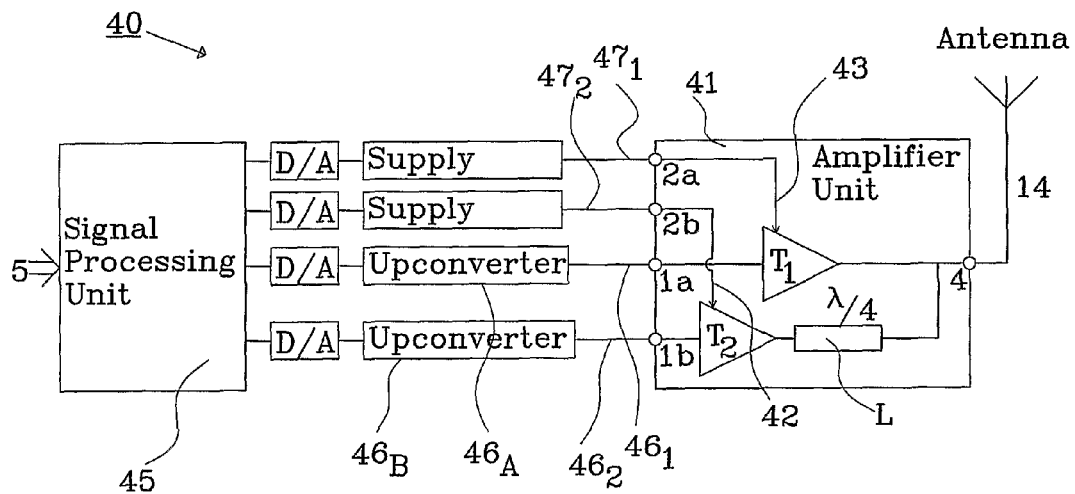
FIG. 13. shows a third embodiment of an amplifier according to the invention.

A third embodiment of a signal amplifying system 40 is shown in FIG. 13 comprising a reverse Doherty system combined with EER/DDB. An amplifier unit 41 comprises a first power amplifier $T_1$ and a second power amplifier $T_2$. Both $T_1$ and $T_2$ are fed by a controlled separate power supply voltage through lines 42 and 43, respectively. An output of the first power amplifier $T_1$ is connected to an output connection 4 of the amplifier unit 41, and an output of the second power amplifier $T_2$ is connected to the output connection 4 of the amplifier unit 41 via a transmission line L. The output connection 4 is connected to a load, such as an antenna 14. An input of the first power amplifier $T_1$ is connected to a first drive signal input connection 1a of the amplifier unit 41, and an input of the second power amplifier $T_2$ is connected to a second drive signal input connection 1b of the amplifier unit 41. The lines 42 and 43 for feeding the power supply voltage to $T_1$ and $T_2$ are connected to a respective power supply input connection 2a and 2b. In contrast to the first described embodiment, there is no need for a separate control signal in this embodiment, since the drive signals fed to the power amplifiers $T_1$ and $T_2$ are used for this purpose. Two independent supply voltages are needed since the RF voltages on the outputs of the amplifiers $T_1$ and $T_2$ have different amplitudes.

The signals are also here regarded as coming from a combined "Signal Processing" block 45. The signal processing unit 45 is provided with means to form the necessary control and drive signals to be supplied to the amplifier unit 41 from the input information signal 5. In this embodiment a first drive signal $46_1$, a second drive signal $46_2$, a first controlled power supply voltage $47_1$ and a second controlled power supply voltage $47_2$ needs to be provided to the amplifier unit 41. The drive signals to each amplifier may be modified in amplitude in such a way that the amplitude is altered relative to the amplitude desired at the output connection. All signals are created digitally in the signal processing unit 45 and are converted to analog signals using separate Digital-to-Analog converters (D/A). The drive signals $46_1$ and $46_2$ are processed in two separate upconverters $46_A$ and $46_B$ before the drive signals are fed to the first and second drive signal input connection 1a and 1b, respectively, of the amplifier unit 41. The power supply voltage is processed in two separate power supply units 47$_A$ and 47$_B$ before the power supply voltages is applied to the power supply input connections 2a and 2b, respectively.

The reverse Doherty system can be built with the same components as a regular Doherty system, wherein the electric length of the transmission line L is selected to be λ/4.

Reverse Doherty action causes one amplifier RF voltage to be lower than the class B voltage for a wide range of output levels. The other amplifier RF voltage is largely unaffected. The RF voltage lowering effect is thus weaker than in the previously discussed reverse Load Modulation system and the reverse Chireix system.

An exemplary reverse Doherty system combined with EER/DDB is built with two transistors that each has an optimal load resistance of 2, a shunt loss resistance of 4, a maximum RF voltage at the transistor Output of 1. no "knee" voltage, and a maximal RF output current of 0.75. A quarter wavelength transmission line having characteristic impedance equal to its optimum load connects the second transistor to a common load equal to the parallel connection of the two optimal loads. The first transistor is connected directly to the common load. The behaviour of the PA is shown in FIGS. 14a-14c.

Figure 14A:
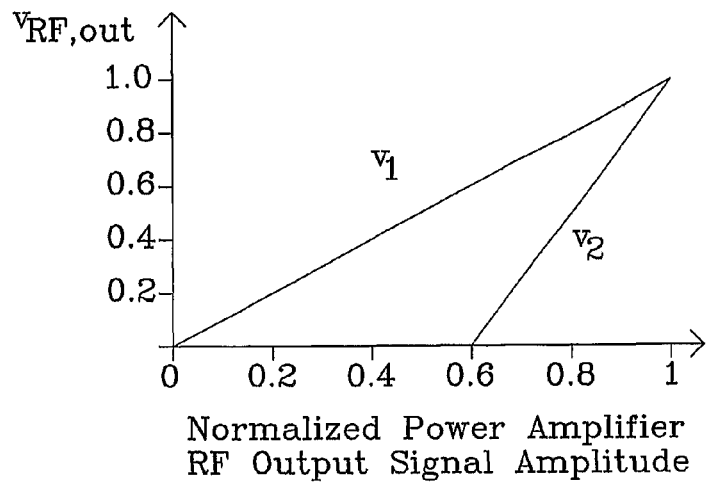
FIGS. 14a-14c show the RF characteristics of the embodiment in FIG. 13.
Figure 14B:
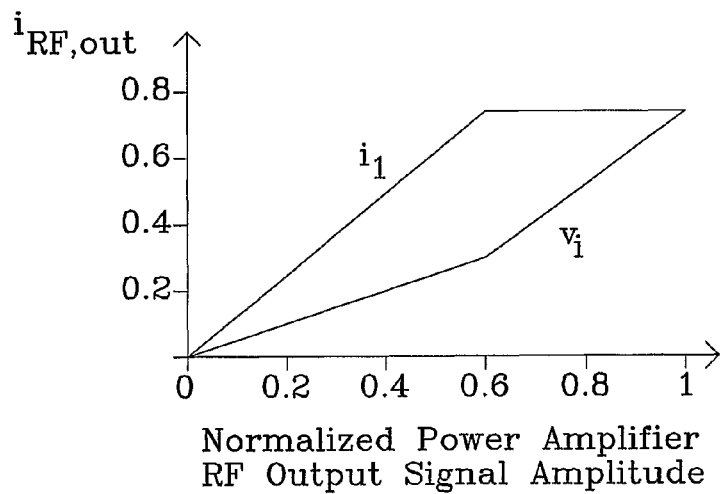

FIG. 14a shows the amplifier output RF voltage amplitudes, and FIG. 14b shows the RF output current amplitudes. The phase relations are not shown, but have no variation and are always 0 or π/2. The Operation mode is the same in the lower 60% of the output range, with zero voltage on the output of the second transistor, above which this voltage rises linearly to end at the same voltage as the first transistor. The current limitation of the first transistor is what causes the end of the zero-voltage region.

Figure 14C:
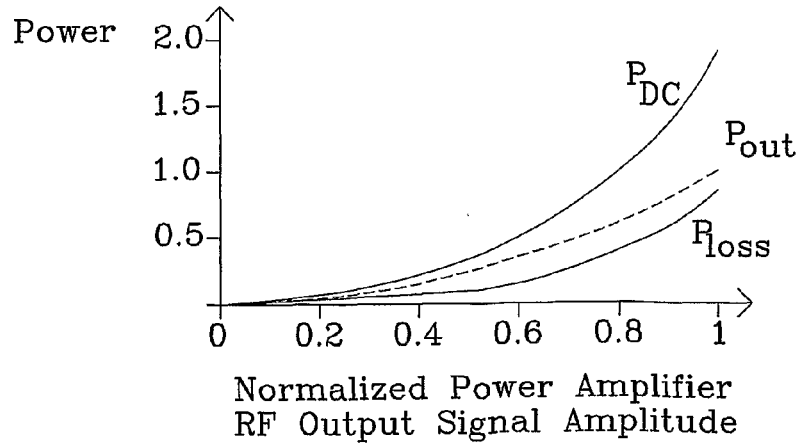

FIG. 14c shows the DC supply power (continuous top trace), the output power (dashed trace) and the loss power (continuous bottom trace).

Figure 15:
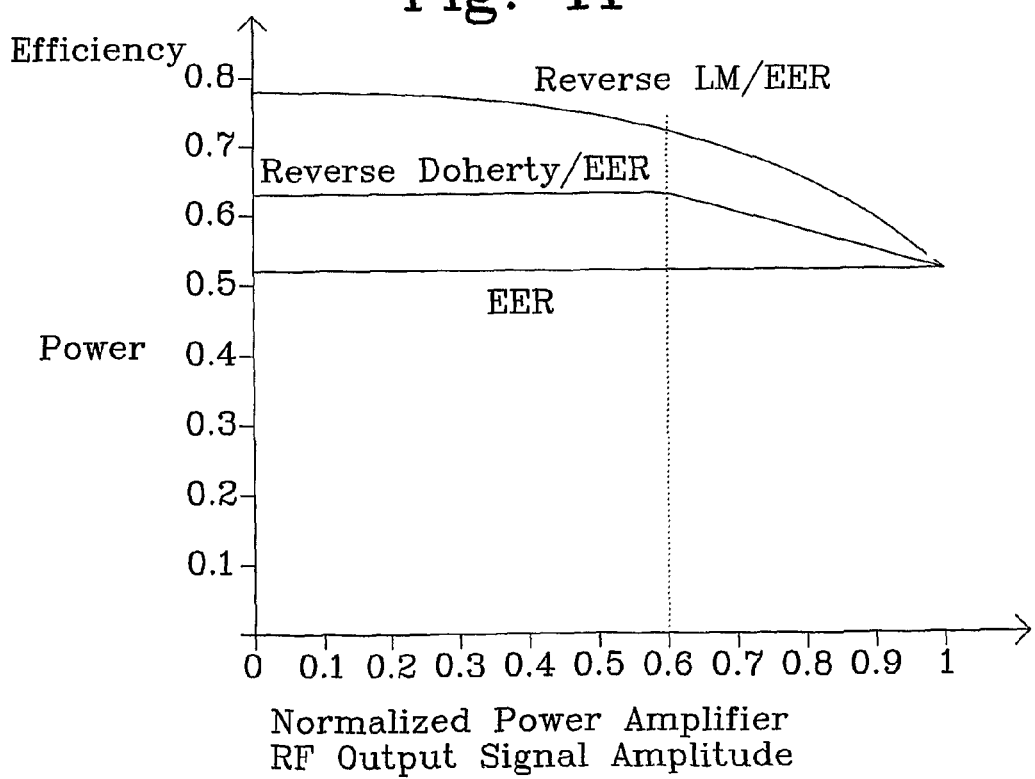
FIG. 15 shows a graph with the efficiency of the embodiment in FIG. 13 in comparison with reverse LM/EER and EER power amplifier efficiency.

FIG. 15 shows the efficiency curve of the reverse Chireix/EER PA. The efficiency in the lower 60% output region is constant after which it starts to fall off towards ⅔ of class B efficiency. The efficiency of the reverse LM/EER and ordinary EER from FIG. 4 is also included in FIG. 15 The reverse Doherty System do not reach the reverse LM efficiency except at the topmost level. This is due to the weaker RF voltage lowering effect of reverse Doherty Systems.

Reverse Doherty, reverse Chireix, or reverse Load Modulation reduces the loss due to shunt resistance (conductance) at the transistor output nodes of the amplifier and can vastly improve the efficiency of EER/DDB Systems. It gives higher efficiency than either constituent method by itself, and also gives higher efficiency than the methods combined in the regular way.

By addition of EER/DDB, reverse Doherty, reverse Chireix, or reverse Load Modulation can be used to increase efficiency even in situations where transistor shunt losses would render the regular Doherty, Chireix, or Load Modulation methods (almost) useless.

For reverse Load Modulation and reverse Chireix Systems, the EER/DDB supply voltage vs. Output level gets a more parabolic shape, which is beneficial since it reduces the (voltage) bandwidth.

The amplifier unit may naturally comprise more than two combined amplifiers, and the claims should not be limited to only two amplifiers. Examples of Chireix and Doherty amplifiers that contain more than two amplifiers are disclosed in the PCT publications WO 2004/057755 and WO 2004/023647, both assigned to Telefonaktiebolaget LM Ericsson and hereby incorporated by reference.

The invention claimed is:

1. A method for controlling an amplifier unit, wherein said amplifier unit comprises at least one drive signal input connection, at least one power supply voltage input connection and an output connection, and wherein said amplifier unit comprises at least one amplifier, the method comprising the steps of:
   feeding each amplifier by a drive signal from said at least one drive signal input connection;
   feeding each amplifier by a power supply voltage from said at least one power supply voltage input connection;
   wherein said amplifier unit has defined output characteristics at the output connection and a predetermined power supply voltage at a maximum RF output power for an RF signal;
   operating at least one amplifier with RF output voltage characteristics to obtain a reduced shunt loss, compared to a reference shunt loss, at the output connection, wherein said reference shunt loss is obtained when operating each amplifier as a class B amplifier having the defined output characteristics at the output connection and the predetermined power supply voltage at a maximum RF output power for the RF signal; and,
   modulating the power supply voltage to each amplifier to reduce excessive voltage drop over the amplifier.

2. The method according to claim 1, wherein the step of operating at least one amplifier with the RF output voltage characteristics comprises the step of:
   controlling the RF output voltage from each amplifier in such a way that at least one amplifier operates below a linear RF output voltage in a part of an output voltage range.

3. The method according to claim 1 wherein each amplifier is connected to a matching network, wherein the step of operating the amplifier with the RF output voltage characteristics comprises the step of:
   changing the properties of the matching network in such a way that, in a part of an output power amplitude range, a load impedance seen from each amplifier output is below an optimal load impedance at maximum output power from the amplifier.

4. The method according to claim 3, wherein said amplifier unit further comprises at least one control signal input connection, wherein the step of changing the properties of the matching circuit is controlled by at least one control signal received at the at least one control signal input connection.

5. The method according to claim 4, further comprising the step of selecting the amplifier unit to includes a Load Modulation amplifier.

6. The method according to claim 1, wherein said amplifier unit comprises at least two amplifiers connected to a phase shifting network, wherein the step of operating the amplifier with the RF output voltage characteristics comprises the step of:
   individually modulating the drive signal being fed to each amplifier in such a way that a load impedance seen from each amplifier output always is below an optimal load impedance at maximum output power from the amplifier.

7. The method according to claim 6, wherein the same power supply voltage is fed to the amplifiers, and wherein the step of individually modulating the drive signal to each amplifier comprises modification of both phase and amplitude.

8. The method according to claim 7, further comprising the step of selecting the amplifier unit to include a Chireix amplifier.

9. The method according to claim 6, wherein a different power supply voltage is fed to each amplifier, and wherein the step of individually modulating the drive signal to each amplifier comprises modification of amplitude.

10. The method according to claim 9, further comprising the step of selecting the amplifier unit to include a Doherty amplifier.

11. The method according to claim 6, wherein said phase shifting network is implemented as one or more transmission lines.

12. An antenna arrangement comprising a signal processing unit, an amplifier unit and an antenna, wherein said signal processing unit supplies at least one drive signal and at least one power supply voltage to said amplifier unit, and wherein an antenna signal is supplied to said antenna from said amplifier unit, wherein said antenna arrangement further comprises a control system for performing the method as defined in claim 1.

13. A base station for telecommunication purposes, wherein said base station includes an antenna arrangement as defined in claim 12.

14. A software for controlling an amplifier unit, wherein said software performs the method as defined in claim 1.

15. A power amplifier arrangement comprising:
an amplifier unit, said amplifier unit comprising at least one drive signal input connection, at least one power supply voltage input connection and an output connection, wherein said amplifier unit comprises at least one amplifier;
a signal processing unit arranged to:
feed each amplifier with a drive signal from said at least one drive signal input connection; and,
feed each amplifier with a power supply voltage from said at least one power supply voltage input connection;
wherein said amplifier unit has defined output characteristics at the output connection and a predetermined power supply voltage at a maximum RF output power for an RF signal, wherein the signal processing unit of the power amplifier arrangement is further arranged to:
operate at least one amplifier with RF output voltage characteristics to obtain a reduced shunt loss, compared to a reference shunt loss, at the output connection, wherein said reference shunt loss is obtained when operating each amplifier as a class B amplifier having the defined output characteristics at the output connection and the predetermined power supply voltage at a maximum RF output power for the RF signal; and,
modulate the power supply voltage to each amplifier to reduce excessive voltage drop over the amplifier.

16. The power amplifier arrangement according to claim 15, wherein each amplifier is connected to a matching network, wherein the signal processing unit is arranged to operate the amplifier with the RF output voltage characteristics by changing the properties of the matching network in such a way that, in a part of an output amplitude range, a load impedance seen from each amplifier output is below an optimal load impedance at maximum output power from the amplifier.

17. The power amplifier arrangement according to claim 16, wherein said amplifier unit further comprises at least one control signal input connection, wherein the signal processing unit forms at least one control signal received at the at least one control signal input connection for changing the properties of the matching circuit.

18. The power amplifier arrangement according to claim 17, wherein the amplifier unit includes a Load Modulation amplifier.

19. The power amplifier arrangement according to claim 15, wherein said amplifier unit comprises at least two amplifiers connected to a phase shifting network wherein the the drive signal being fed to each amplifier is individually modulated in such a way that a load impedance seen from each amplifier output always is below an optimal load impedance at maximum output power from the amplifier.

20. The power amplifier arrangement according to claim 19, wherein the same power supply voltage is fed to the amplifiers and wherein the signal processing unit is arranged to individually modify the drive signal to each amplifier in both phase and amplitude.

21. The power amplifier arrangement according to claim 20, wherein the amplifier unit includes a Chireix amplifier.

22. The power amplifier arrangement according to claim 19, wherein a different power supply voltage is fed to each amplifier, and wherein the signal processing unit is arranged to individually modify the drive signal to each amplifier in amplitude.

23. The power amplifier arrangement according to claim 22, wherein the amplifier unit includes a Doherty amplifier.

24. The power amplifier arrangement according to claim 19, wherein said phase shifting network is implemented as one or more transmission lines.

* * * * *

UNITED STATES PATENT AND TRADEMARK OFFICE
CERTIFICATE OF CORRECTION

| | | |
|---|---|---|
| PATENT NO. | : 8,045,939 B2 | Page 1 of 1 |
| APPLICATION NO. | : 12/374898 | |
| DATED | : October 25, 2011 | |
| INVENTOR(S) | : Hellberg et al. | |

It is certified that error appears in the above-identified patent and that said Letters Patent is hereby corrected as shown below:

In Column 2, Line 20, delete "Chireix." and insert -- Chireix, --, therefor.

In Column 9, Line 19, delete "1." and insert -- 1, --, therefor.

In Column 12, Line 26, in Claim 19, delete "the the" and insert -- the --, therefor.

Signed and Sealed this
Thirty-first Day of January, 2012

David J. Kappos
*Director of the United States Patent and Trademark Office*